(12) United States Patent
Inada et al.

(10) Patent No.: US 6,616,762 B2
(45) Date of Patent: Sep. 9, 2003

(54) TREATMENT SOLUTION SUPPLY APPARATUS AND TREATMENT SOLUTION SUPPLY METHOD

(75) Inventors: Hiroichi Inada, Kumamoto (JP); Hirofumi Ookuma, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/975,182

(22) Filed: Oct. 10, 2001

(65) Prior Publication Data

US 2002/0043214 A1 Apr. 18, 2002

(30) Foreign Application Priority Data

Oct. 13, 2000 (JP) .......................................... 2000-313550

(51) Int. Cl.$^7$ .............................. B05C 5/00; B05C 13/02
(52) U.S. Cl. ........................ 118/319; 118/52; 118/320; 118/321
(58) Field of Search ................ 638/758, 780; 118/52, 319, 320, 321

(56) References Cited

U.S. PATENT DOCUMENTS

| | | |
|---|---|---|
| 5,665,200 A | 9/1997 | Fujimoto et al. |
| 5,672,205 A | 9/1997 | Fukimoto et al. |
| 6,371,667 B1 * | 4/2002 | Kitano et al. ................ 396/611 |

* cited by examiner

Primary Examiner—Alexander Ghyka
(74) Attorney, Agent, or Firm—Rader, Fishman & Grauer PLLC

(57) ABSTRACT

A treatment solution supply apparatus according to the present invention is a treatment solution supply apparatus for supplying a treatment solution onto a substrate which is disposed in a predetermined processing position on a mounting portion, comprising a treatment solution supply nozzle for supplying the treatment solution onto the substrate and a nozzle holder for releasably holding the treatment solution supply nozzle. The treatment solution supply nozzle is disposed in a predetermined stand-by position and the nozzle holder is movable in three dimensions. The movability of the nozzle holder in three dimensions makes it possible to finely adjust the position of the treatment solution supply nozzle and thereby, supply the treatment solution accurately to an appropriate position on the substrate.

14 Claims, 15 Drawing Sheets

TREATMENT SOLUTION SUPPLY APPARATUS AND TREATMENT SOLUTION SUPPLY METHOD

BACKGROUND OF THE INVENTION

1. Field of the Invention

The present invention relates to a treatment solution supply apparatus and a treatment solution supply method.

2. Description of the Related Art

In a photolithography process, for example, in semiconductor device fabrication processes, resist coating treatment for applying a resist solution on a surface of a substrate, for example, a semiconductor wafer (hereinafter referred to as a 'wafer'), to form a resist film, exposure processing for exposing the wafer in a pattern, developing treatment for developing the wafer after being exposed in the pattern, and so on are performed to form a predetermined circuit pattern on the wafer.

The above resist coating treatment is usually performed in a resist coating unit. This resist coating unit includes a spin chuck 120 for mounting the wafer thereon and rotating the wafer, a plurality of resist solution supply nozzles 121 for supplying the resist solution to the wafer from a position above a center of the wafer, and a carrier 122 for holding and carrying the resist solution supply nozzles 121, when the resist solution is applied, for example, as shown in FIG. 15.

The carrier 122 includes a nozzle holder 123 for holding the resist solution supply nozzles 121 and an arm portion 124 to which the nozzle holder 123 is attached. The arm portion 124 is structured to be movable along a rail 125 which extends in an X-direction beside the spin chuck 120. The arm portion 124 is also movable in a Z-direction. The nozzle holder 123 is fixed to the arm portion 124 in a predetermined position so that the nozzle holder 123 is positioned above the center of the wafer W when the arm portion 124 moves to be positioned above the center of the wafer.

Before being held by the nozzle holder 123, the resist solution supply nozzles 121 are kept on stand-by in a nozzle box 126 which is disposed beside the spin chuck 120. The nozzle box 126 is movable in a Y-direction. Then, when one of the resist solution supply nozzles 121 held by the nozzle holder 123 is to be replaced by another one of the resist solution supply nozzles 121, the nozzle box 126 moves in the Y-direction to position said another one of the resist solution supply nozzle 121, which is to be held next, under the nozzle holder 123.

Therefore, in the above-described resist coating unit, the resist coating treatment is performed in a manner in which the arm portion 124 moves in the X and Z-directions so that the nozzle holder 123 holds the resist solution supply nozzle 121 which is kept on stand-by in the nozzle box 126 and the resist solution supply nozzle 121 is caused to move to a position above the center of the wafer and thereafter, the resist solution is supplied to the rotated wafer from the resist solution supply nozzle 121.

However, the position of the nozzle holder 123 cannot be finely adjusted in the Y-direction even when the resist solution discharged from the resist solution supply nozzle 121 which is held by the nozzle holder 123 is not accurately supplied to the center of the wafer since the nozzle holder 123 is fixed to the arm portion 124. Thus, when the resist solution cannot be supplied to the center of the wafer due to the inability of finely adjusting the position of the nozzle holder 123, the supply amount of the resist solution needs to be increased so much more in order to form a uniform resist film on the wafer, which results in an increase in cost.

SUMMARY OF THE INVENTION

The present invention is made in consideration of the above-described aspects and provides a treatment solution supply apparatus and a treatment solution supply method in which the adjustment of the position of a treatment solution supply nozzle is facilitated so that a treatment solution such as a resist solution discharged from a treatment solution supply nozzle is supplied to an accurate position on a substrate such as a wafer.

A treatment solution supply apparatus according to the present invention is a treatment solution supply apparatus for supplying a treatment solution onto a substrate which is disposed in a predetermined processing position on a mounting portion, comprising: a treatment solution supply nozzle for supplying the treatment solution onto the substrate; and a nozzle holder for releasably holding the treatment solution supply nozzle, wherein the treatment solution supply nozzle is disposed in a predetermined stand-by position and the nozzle holder is movable in three dimensions.

The nozzle holder is structured to be movable in three dimensions as described above so that the position of the treatment solution supply nozzle can be finely adjusted and thereby, the treatment solution can be accurately supplied to an appropriate position on the substrate. Consequently, the treatment solution can be supplied accurately to the center of the substrate, for example, when the treatment solution is supplied onto the rotated substrate so that the amount of the treatment solution used can be decreased so much more. Furthermore, when what is called "position calculation", which means to specify, for example, the center position of the substrate and the position where the plural treatment solution supply nozzles are kept on stand-by, and which is performed before the treatment solution is supplied onto the substrate, is performed, the movement of the nozzle holder in three dimensions also makes it possible to perform a more accurate location without manned mechanical adjustment.

When the plural treatment supply nozzles are provided, the plural treatment supply nozzles are disposed outside the substrate which is in the processing position and may be arranged in an arc shape with the center of the substrate being the center of the arc or may be linearly arranged. In this case, it is appropriate that treatment solution tubes connected to the respective treatment solution supply nozzles are disposed to radially extend in an outward direction from the respective treatment solution supply nozzles with the center of the substrate which is disposed in the predetermined processing position being the center of the radiation. This arrangement is appropriate since it can appropriately prevent the tubes from contacting each other.

In the treatment solution supply apparatus according to the present invention, a hole formed in the center of the processing position on the mounting portion, a light-emitting part for emitting a light through the hole in an upward direction, a light-receiving part, which is provided in the nozzle holder, for receiving the emitted light, and a specifying device for specifying, based on a position where the light-receiving part receives the light from the light-emitting part, the position of the center of the substrate disposed in the processing position may further be added. In this case, a laser displacement gauge may be provided in the nozzle holder side to detect the hole, instead of providing the light-emitting part in the hole.

Moreover, a specifying mechanism for specifying, based on the position of the nozzle holder when the nozzle holder holds an optional one of the treatment solution supply nozzles which is positioned in the stand-by position, coordinates of the stand-by position of the optional treatment solution supply nozzle in a coordinate system including the processing position may be added.

For more direct detection, an image pickup device for monitoring the substrate disposed in the processing position may be used for monitoring.

A treatment solution supply method according to the present invention utilized a treatment solution supply apparatus comprising: a mounting portion for mounting the substrate thereon; a plurality of treatment solution supply nozzles for supplying the treatment solution on the substrate; and a nozzle holder movable in three dimensions for holding the treatment solution supply nozzles, in which the treatment solution supply nozzles are disposed outside the substrate which is on the mounting portion and are arranged in a predetermined stand-by position in an arc shape with the center of the substrate being the center of the arc. The treatment solution supply method according to the present invention comprises the steps of: holding the treatment solution supply nozzle kept in the stand-by position, with the nozzle holder moving thereto; and carrying by the nozzle holder the treatment solution supply nozzle linearly from the stand-by position to a position above the center of the substrate on the mounting portion.

A treatment solution supply method according to the present invention is a treatment solution supply method for supplying a treatment solution onto a substrate, wherein utilized is a treatment solution supply apparatus comprising: a mounting portion for mounting the substrate thereon; a treatment solution supply nozzle for supplying a treatment solution on the substrate; and a nozzle holder movable in three dimensions for releasably holding the treatment solution supply nozzle, and utilized is a position detector having a shape same as that of the substrate. The position detector includes two light-emitting parts for linearly emitting lights in a manner in which the lights are emitted from different positions and pass through a center, namely, a center of the position detector having the shape same as that of the substrate, and two light-receiving parts for receiving the emitted lights from the light-emitting parts.

The treatment solution supply method according to the present invention comprises the steps of: disposing the position detector in a predetermined processing position on the mounting portion before the treatment solution is supplied onto the substrate; and moving the treatment solution supply nozzle held by the nozzle holder to the center of the position detector to position the treatment solution supply nozzle in a position where the treatment solution supply nozzle blocks the two linear lights synchronously.

According to the treatment solution supply method of the present invention, the nozzle holder is movable in three dimensions, which makes it possible to finely adjust the position of the treatment solution supply nozzle to accurately supply the treatment solution to an appropriate position on the substrate. Furthermore, the treatment solution supply nozzle is carried linearly, which makes it possible to move the treatment solution supply nozzle quickly to a predetermined position.

Moreover, according to the treatment solution supply method, the position detector is utilized so that the treatment solution supply nozzle can be positioned in the position where the treatment solution supply nozzle blocks the two linear lights synchronously, which makes it possible to position the treatment solution supply nozzle in the "center position" quickly and accurately.

DETAILED DESCRIPTION OF THE PREFERRED EMBODIMENTS

Figure 1:
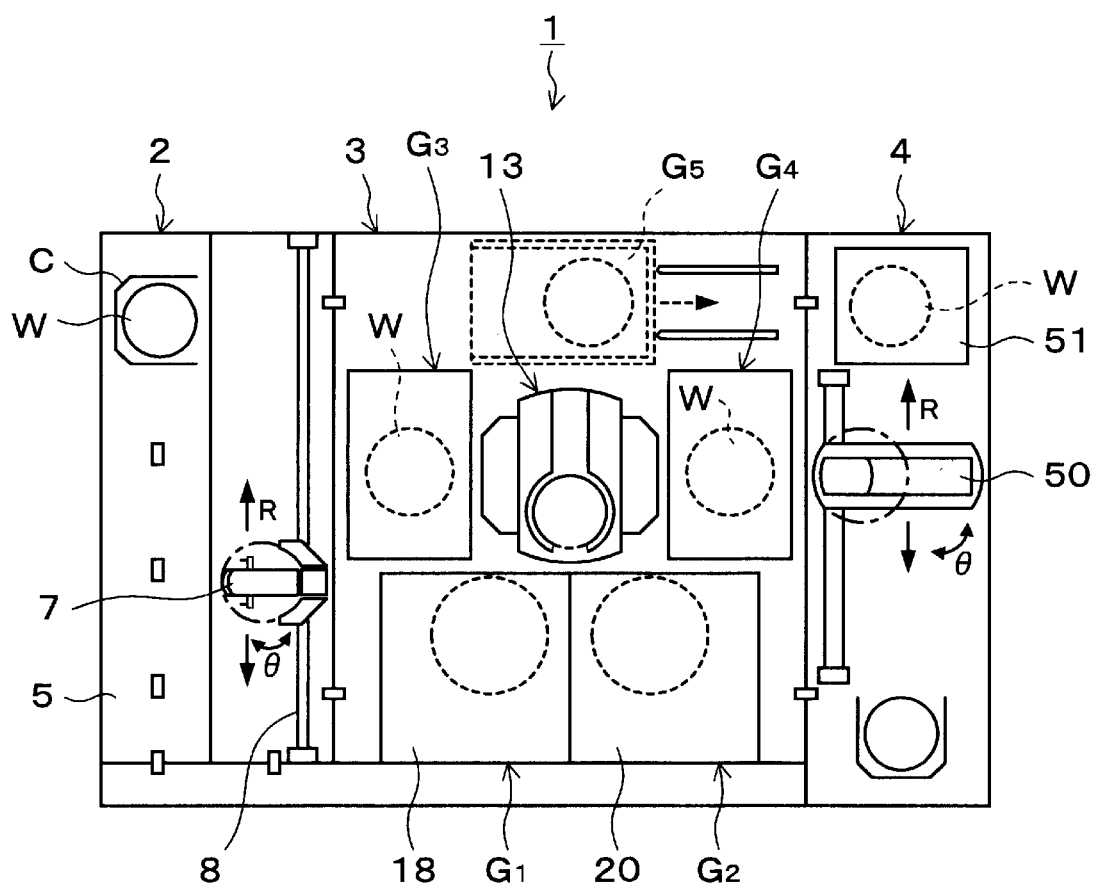
FIG. 1 is a plan view showing a schematic structure of a coating and developing treatment system including a resist coating unit provided with a resist solution supply apparatus according to an embodiment of the present invention.
Figure 2:
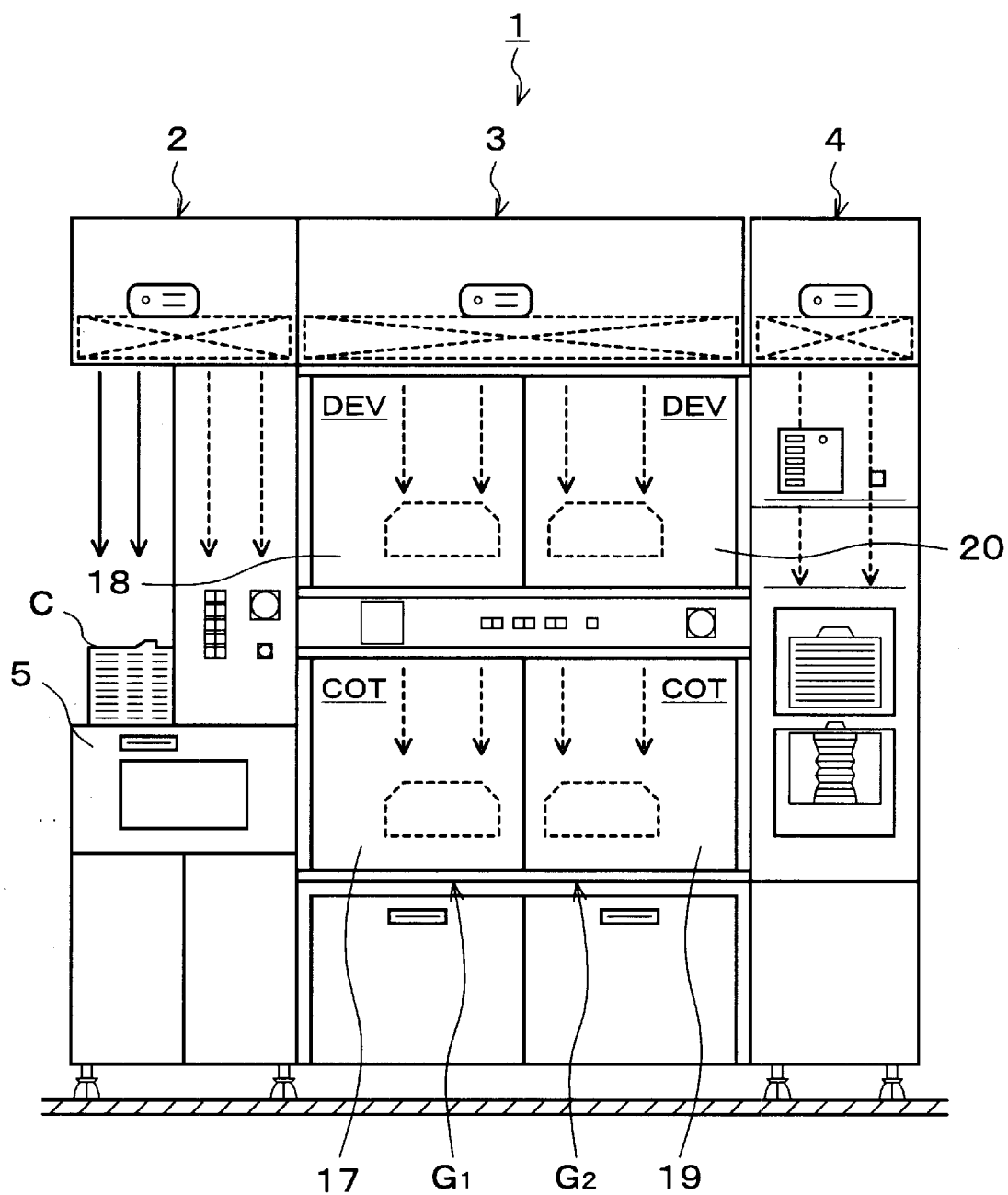
FIG. 2 is a front view of the coating and developing treatment system in FIG. 1.
Figure 3:
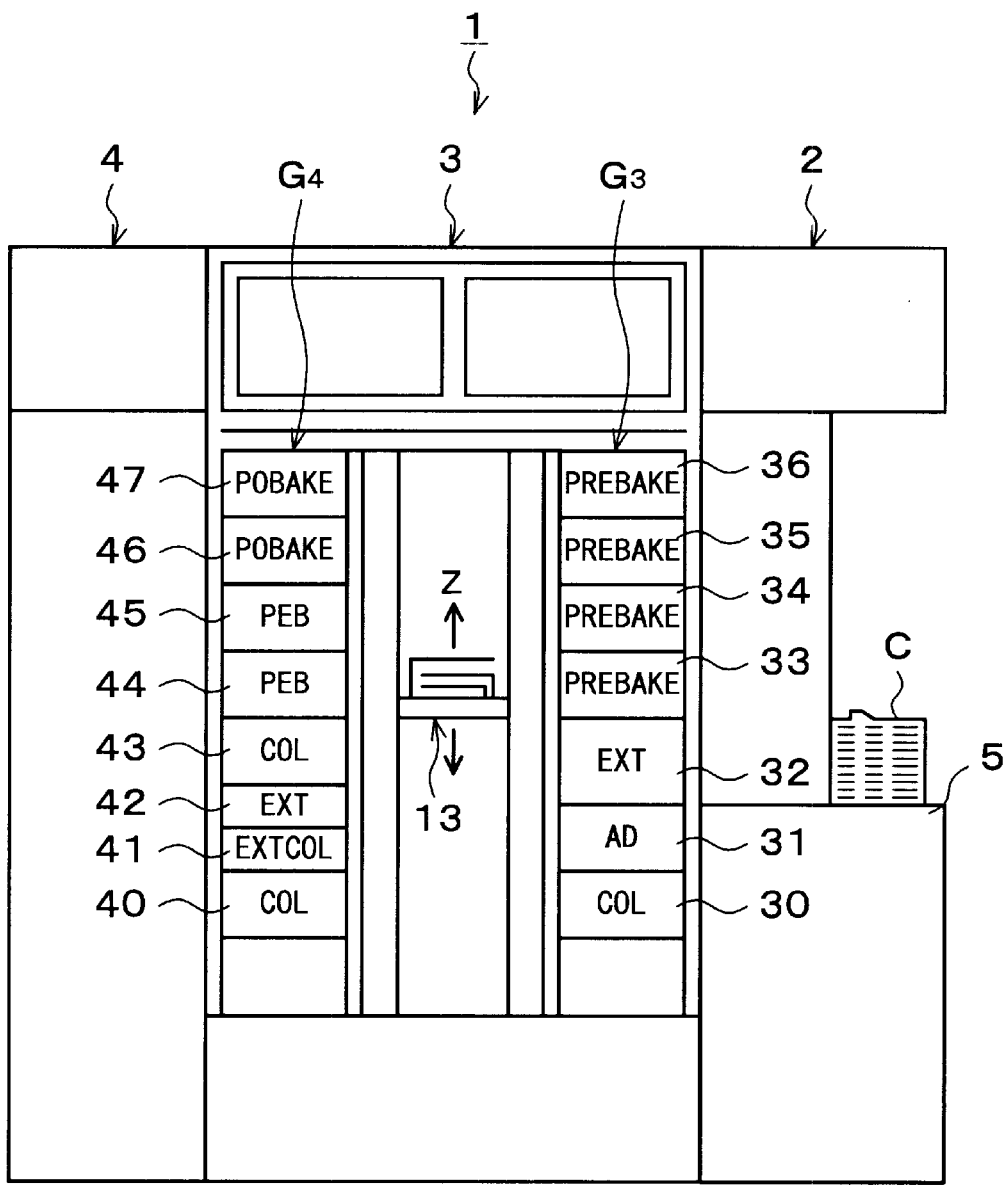
FIG. 3 is a rear view of the coating and developing treatment system in FIG. 1.

Preferred embodiments of the present invention will be described below to detail the present invention. FIG. 1 is a plan view of a coating and developing treatment system 1 including a resist coating unit provided with a treatment solution supply apparatus according to this embodiment, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering the wafers W to/from a not-shown aligner which is disposed adjacent to the processing station 3 are integrally connected.

In the cassette station 2, a plurality of the cassettes C are mountable in predetermined positions on a cassette mounting table 5, which serves as a mounting portion, in a line in an R-direction (a vertical direction in FIG. 1). Furthermore, a wafer carrier 7, which is movable in the alignment direction of the cassettes (the R-direction) and in an alignment direction of the wafers W housed in the cassette C (a Z-direction; a perpendicular direction), is provided to be movable along a carrier path 8 so that it is selectively accessible to each of the cassettes C.

The wafer carrier 7 has an alignment function for aligning the wafers W. The wafer carrier 7 is structured so as to be also accessible to an extension unit 32 included in a third processing unit group G3 on a processing station 3 side as will be described later.

In the processing station 3, a main carrier 13 is provided in a center part thereof, and various kinds of the processing units are multi-tiered on a periphery of the main carrier 13 to constitute a processing unit group. In the coating and developing treatment system 1, where four processing unit groups G1, G2, G3 and G4 are provided, the first and the second processing unit groups G1 and G2 are disposed on a front side of the coating and developing treatment system 1, the third processing unit group G3 is disposed adjacent to the cassette station 2, and the fourth processing unit group G4 is disposed adjacent to the interface section 4. Furthermore, a fifth processing unit group G5 depicted by the broken line is allowed to be additionally disposed on a rear side as an option. The main carrier 13 is capable of carrying the wafers W to/from various kinds of later described processing units which are disposed in these processing unit groups G1, G2, G3, and G4. Incidentally, the number and the arrangement of the processing unit groups vary depending on which kind of processing is performed on the wafers W and the number of the processing unit groups needs not be four as long as it is one or more.

In the first processing unit group G1, for example, as shown in FIG. 2, a resist coating unit 17 provided with the treatment solution supply apparatus according to this embodiment, for applying a resist solution onto the wafer W and a developing unit 18 for developing the wafers W after exposure processing are two-tiered in the order from the bottom. Similarly, in the second processing unit group G2, a resist coating unit 19 and a developing unit 20 are two-tiered in the order from the bottom.

In the third processing unit group G3, for example, as shown in FIG. 3, a cooling unit 30 for cooling the wafers W, an adhesion unit 31 for increasing fixability between a resist solution and the wafers W, the extension unit 32 for keeping the wafers W on stand-by therein, pre-baking units 33 and 34 for drying a solvent in the resist solution, post-baking units 35 and 36 for performing heat treatment after the developing treatment, and so on are, for example, seven-tiered in the order from the bottom.

In the fourth processing unit group G4, for example, a cooling unit 40, an extension and cooling unit 41 for spontaneously cooling the mounted wafers W, an extension unit 42, a cooling unit 43, post-exposure baking units 44 and 45 for performing heat treatment after the exposure processing, post-baking units 46 and 47, and so on are, for example, eight-tiered in the order from the bottom.

In a center part of the interface section 4, a wafer carrier 50 is provided. The wafer carrier 50 is structured so as to be movable in the R-direction (the vertical direction in FIG. 1) and the Z-direction (the perpendicular direction), and to be rotatable in a θ direction (a rotational direction about an axis Z), so that it is accessible to the extension and cooling unit 41 and the extension unit 42 which are included in the fourth processing unit group G4, a peripheral aligner 51, and the not-shown aligner to carry the wafers W to each of them.

Figure 4:
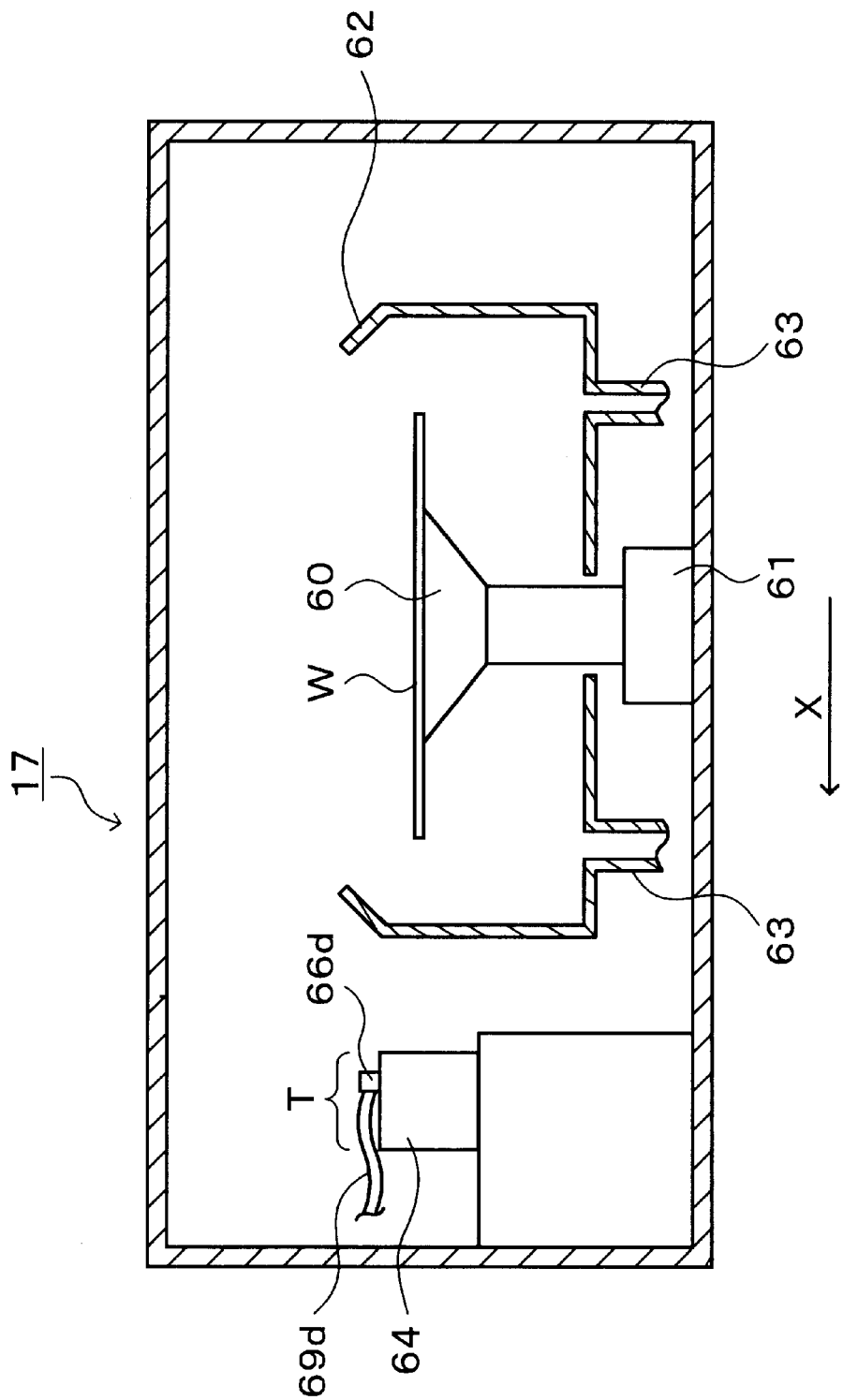
FIG. 4 is a side view showing the inner appearance of the resist coating unit.
Figure 5:
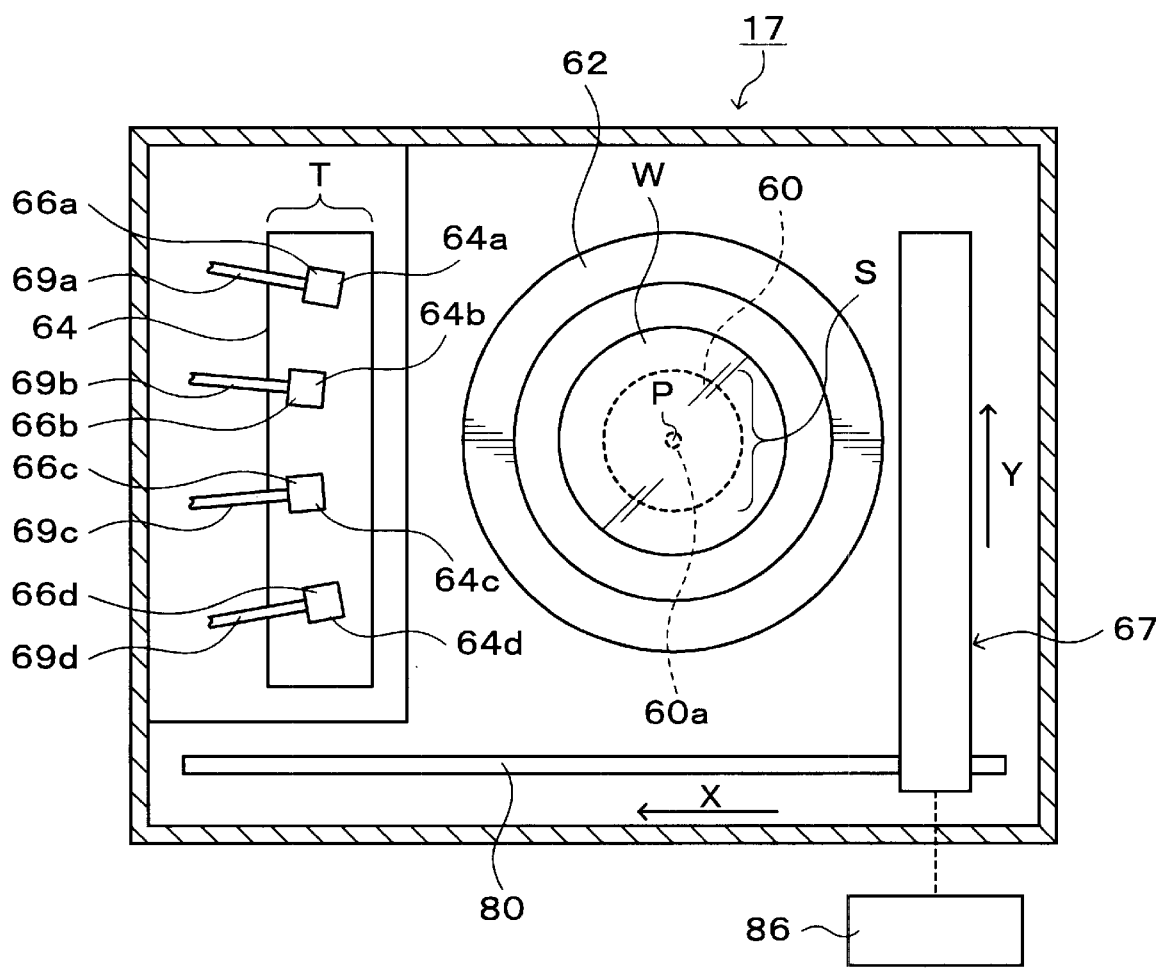
FIG. 5 is a plan view showing the inner appearance of the resist coating unit.

Next, the structure of the resist coating unit 17 described above will be explained in detail. FIG. 4 is an explanatory view of a vertical cross section showing a schematic structure of the resist coating unit 17 and FIG. 5 is an explanatory view of a horizontal cross section of the resist coating unit 17.

In a center part of the resist coating unit 17, a spin chuck 60, which serves as a mounting portion, for holding the wafer W by suction in a predetermined processing position S is provided with an upper surface thereof formed to be flat. In a center part of the spin chuck 60, a hole 60a positioned in the center of the spin chuck 60 as shown in FIG. 5 and recognized as the center of the wafer W which is held in the processing position S on the spin chuck 60 is formed. Under the spin chuck 60, a drive mechanism 61 which causes the spin chuck 60 to move vertically and rotate is disposed, as shown in FIG. 4. A function of the drive mechanism 61 enables the wafer W to rotate at a predetermined rotational speed when the resist solution is applied onto the wafer W and the spin chuck 60 to vertically move when the wafer W is mounted onto the spin chuck 60.

Around an outer circumference of the spin chuck 60, a circular cup 62 with an upper part thereof being open is provided to surround the outer circumference of the spin chuck 60 so that the resist solution spilled by a centrifugal force from the rotated wafer W which is held by suction onto the spin chuck 60 is received in the cup 62 and prevented from contaminating peripheral units. In a bottom portion of the cup 62, a drainpipe 63 for draining out the resist solution which is spilled from the wafer W is formed.

Outside the outer circumference of the cup 62 on a negative direction of an X-direction (a left direction in FIG. 4 and FIG. 5), provided is a standby position T, which is described later, for keeping the resist solution supply nozzles for supplying the resist solution onto the wafer W. In the stand-by position T, a nozzle box 64 is provided where the plural, for example, four, resist solution supply nozzles 66a, 66b, 66c, and 66d are allowed to be kept on stand-by. In the nozzle box 64, four recessed portions 64a, 64b, 64c, and 64d having the same outer shapes as those of the resist solution supply nozzles 66a to 66d are formed and arranged along the outer circumference of the cup 62, in other words, arranged in an arc shape with the center of the wafer being the center of the arc. Receiving the resist solution supply nozzles 66a, 66b, 66c, and 66d in the recessed portion 64a, 64b, 64c, and 64d makes it possible to keep the plural resist solution supply nozzles 66a to 66d on stand-by in a state where they are arranged in the arc shape.

Here, a resist solution supply apparatus 65 for supplying the resist solution onto the wafer W which is held by suction onto the spin chuck 60 is explained.

Figure 6:
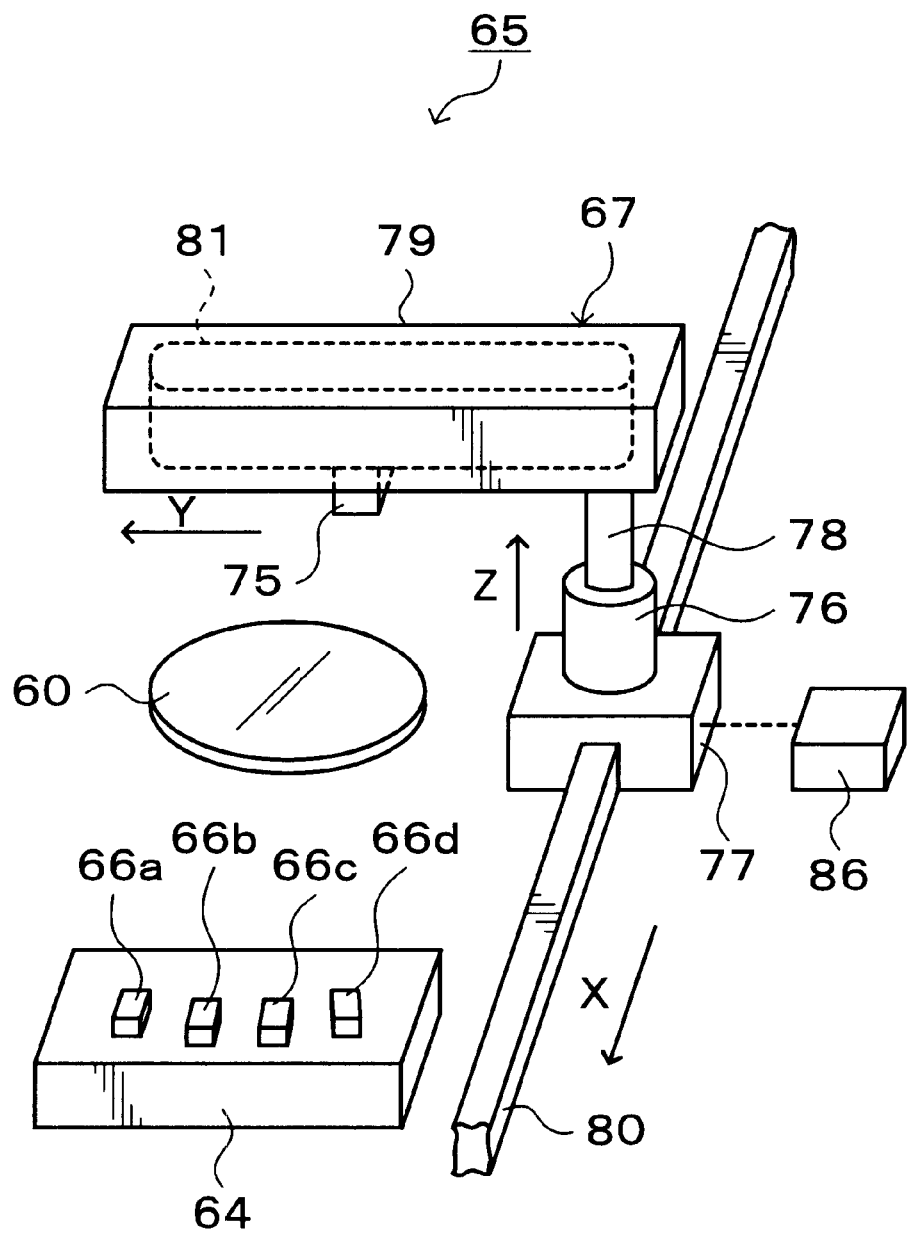
FIG. 6 is a perspective view showing a schematic structure of the resist solution supply apparatus.
Figure 7:
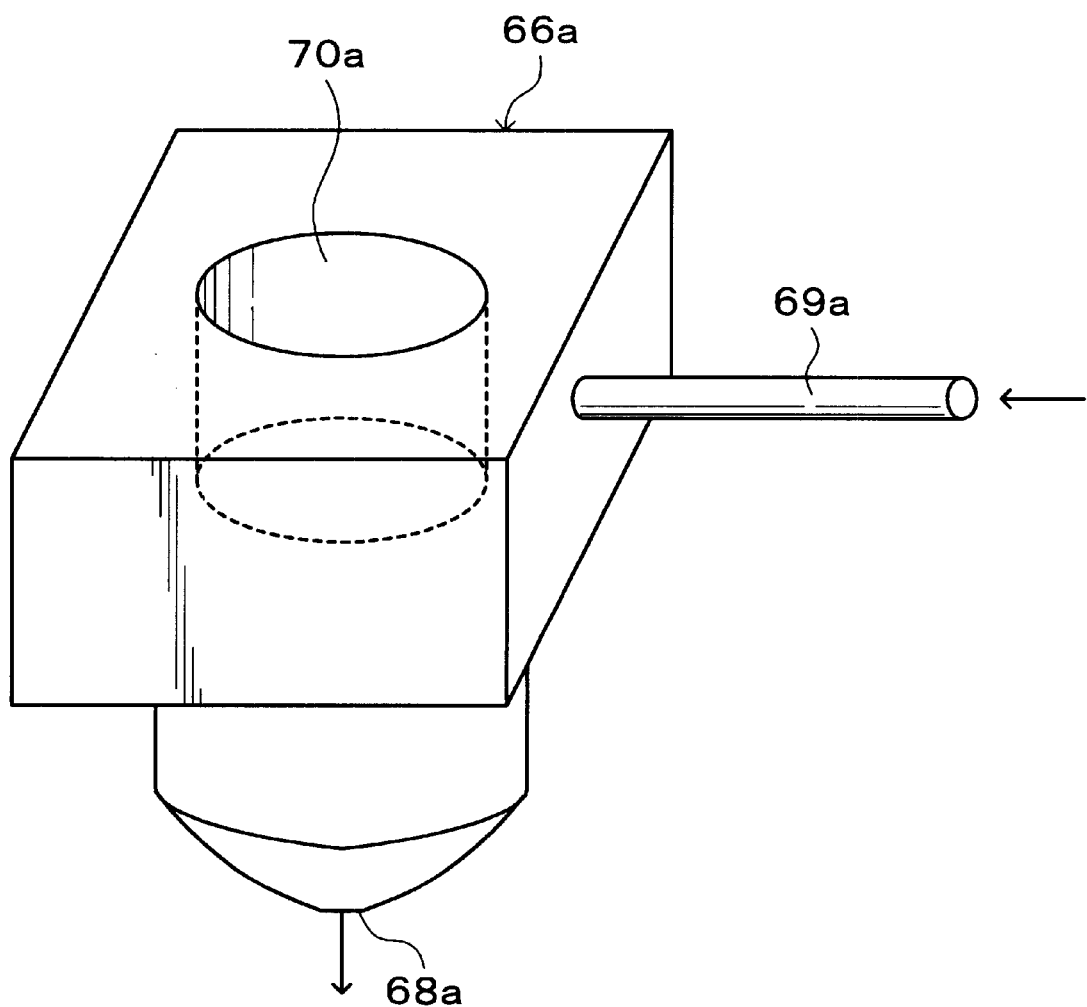
FIG. 7 is a perspective view showing a schematic structure of a resist solution supply nozzle.

The resist solution supply apparatus 65 includes the four resist solution supply nozzles 66a to 66d and a carrier 67 for carrying the resist solution supply nozzles 66a to 66d as shown in FIG. 6.

The resist solution supply nozzle 66a is formed to have an outer shape to be received in the above-mentioned recessed portions 64a to 64d of the nozzle box 64, for example, a substantially rectangular parallelepiped shape. In a lower part of the resist solution supply nozzle 66a, a discharging port 68a for discharging the resist solution therefrom is formed. A tube 69a for supplying the resist solution into the resist solution supply nozzle 66a is connected to a side surface of the resist solution supply nozzle 66a so that the resist solution from a not-shown resist solution supply source can be supplied into the resist solution supply nozzle 66a and discharged from the discharging port 68a. The tube 69a is disposed to extend radially from the resist solution supply nozzle 66a in an outward direction of the cup 62 on the stand-by position T side, as shown in FIG. 5. In an outer circumference portion of the tube 69a, a not-shown temperature adjusting pipe through which temperature adjusting water for adjusting the temperature of the resist solution flows is provided so that the resist solution is supplied onto the wafer W after being adjusted to a predetermined temperature.

In an upper portion of the resist solution supply nozzle 66a, a receiving portion 70a for receiving a nozzle holder 75 of the carrier 67 to hold the resist solution supply nozzle 66a is formed. The receiving portion 70a, which is a bottomed hole having a predetermined depth and being formed downward from an upper surface of the resist solution supply nozzle 66a, is formed, for example, in a circular shape when seen from a plane surface and allows a later-described inserting portion 87, for example, in a cylindrical shape, of the carrier 67 to be inserted therein. Incidentally, the explanation of the structure of the other resist solution supply nozzles 66b, 66c, and 66d and the arrangement of the tubes 69b, 69c, and 69d, which are the same as those of the resist solution supply nozzle 66a and the tube 69a, is omitted.

The carrier 67 includes the nozzle holder 75 for holding the resist solution supply nozzles 66a to 66d and an arm portion 76 for movably holding the nozzle holder 75 as shown in FIG. 6.

The arm portion 76 is composed of a base 77, an arm vertical portion 78 extending in the Z-direction on the base 77, an arm horizontal portion 79 extending from an end of the arm vertical portion 78 in a Y-direction (a horizontal direction perpendicular to the X-direction). The base 77 is movable along a rail 80 extending in the X-direction along a side wall of the resist coating unit 17 as shown in FIG. 5 and FIG. 6 so that the carrier 67 is movable in the X-direction.

Figure 8:
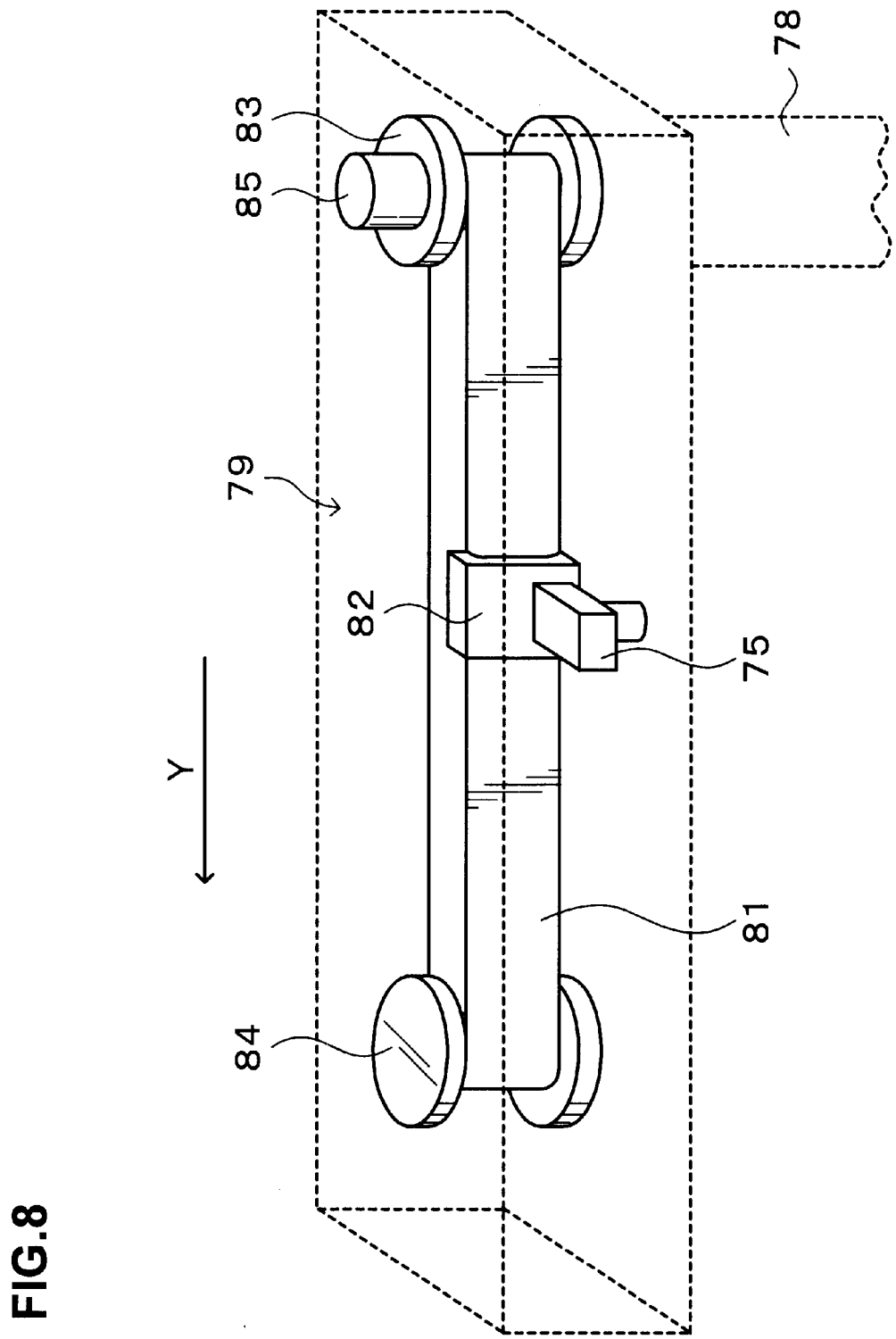
FIG. 8 is a perspective view showing a schematic structure of an arm horizontal portion of a carrier.

The arm vertical portion 78 includes a cylinder which operates in a vertical direction to enable the arm vertical portion 78 to expand and contract in the Z-direction. Thereby, the nozzle holder 75 supported by the arm portion 76 is movable in the Z-direction. A drive belt 81 extending in the Y-direction as shown in FIG. 8 is provided in a casing 79a of the arm horizontal portion 79.

A slider 82 is fixed to the drive belt 81 and furthermore, the nozzle holder 75 is fixed to the slider 82. The drive belt 81 is provided between a drive pulley 83 and a follower pulley 84 which are provided at both ends of the arm horizontal portion 79 and the drive pulley 83 is rotated clockwise and counterclockwise by a rotary drive motor 85. This structure causes the drive belt 81 to be driven and the nozzle holder 75 which is fixed to the slider 82 to move in the Y-direction.

The above structure enables the nozzle holder 75 to move in the X, Y, and Z-directions, in other words, in three dimensions. Drive control in each of the directions is performed by a controlling unit 86. The controlling unit 86 specifies a target position with a home position of the carrier 67 being as a datum point and controls the nozzle holder 75 to move to the target position.

Figure 9:
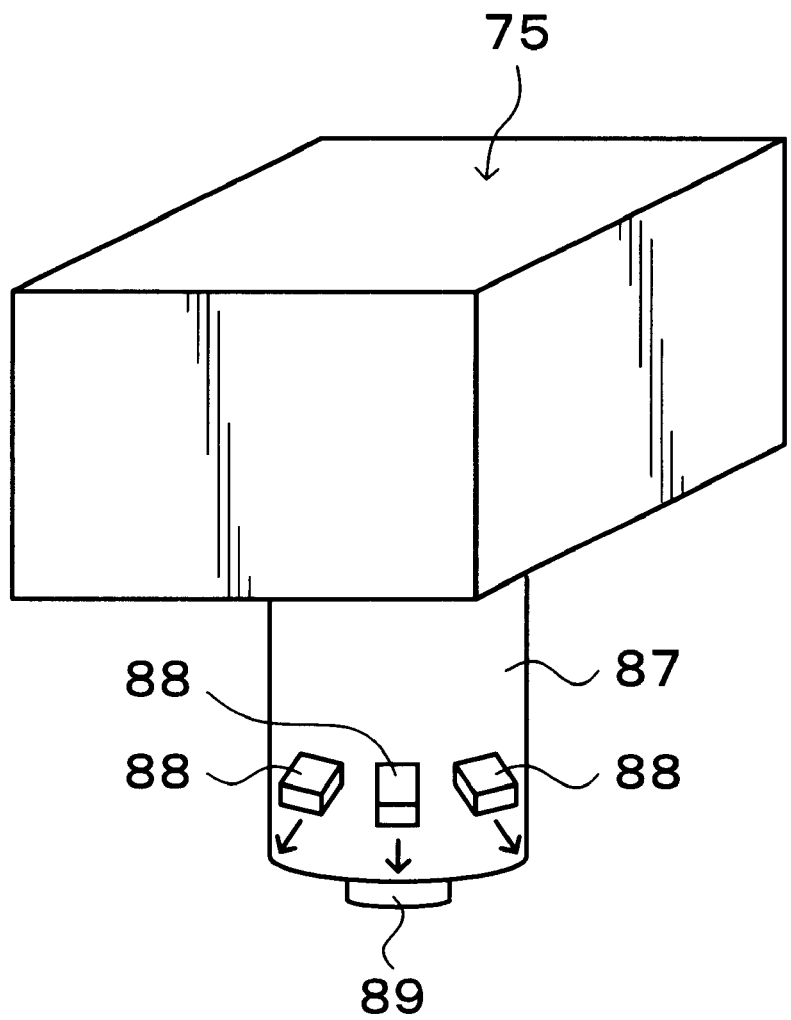
FIG. 9 is a perspective view showing a schematic structure of a nozzle holder.

Meanwhile, in a lower part of the nozzle holder 75 the inserting portion 87 having a protruding shape and extending downward as shown in FIG. 9 is provided. The inserting portion 87 is formed, for example, in a cylindrical shape and can be inserted to the receiving portion 70a in the resist solution supply nozzle 66a. On an outer circumferential surface of the inserting portion 87, a plurality of pressing portions 88 are provided to press against an inner wall of the receiving portion 70a when the inserting portion 87 is inserted into the receiving portion 70a and this pressure enables the nozzle holder 75 to hold the resist solution supply nozzle 66a.

The pressing by the pressing portions 88 is caused when the pressing portions 88 are protruded outward by an air pressure, for example, from a not-shown air pipe, which is connected into the inserting portion 87. Incidentally, the pressing portions 88 may be thus protruded and recessed by a magnetic force instead of the air pressure. In this case, inside the inserting portion 87, an electromagnet whose polarity is switchable is provided and permanent magnets whose polarities are fixed are used for the pressing portions 88. The polarity of the electromagnet inside the inserting portion 87 is switched over so that the permanent magnets in the pressing portions 88 are repelled or attracted by the electromagnet to enable the pressing portions 88 to protrude and recess.

Alternatively, such a structure is also appropriate in which an electromagnet whose magnetic force is switchable between ON and OFF is provided inside the inserting portion 87, magnetic material is used for the pressing portions 88, and resilient members, such as springs, which are biased in a protruding direction, are further provided in the pressing portions 88. In this case, for example, when the electromagnet is in an OFF state, the pressing portions 88 are protruded by the biased force. When the electromagnet is in an ON state, the pressing portions 88 are attracted against the biased force to be recessed in the inserting portion 87. In this way, the pressing portions 88 are structured to protrude and recess.

On a center part of a bottom surface of the inserting portion 87, provided is a laser displacement gauge 89 for detecting the hole 60a in the center part of the spin chuck 60 by emitting a laser beam downward in the Z-direction. The detection result of the laser displacement gauge 89 is sent to the controlling unit 86 shown in FIG. 6, which serves as a specifying device. Based on the detection result, the controlling unit 86 is capable of accurately specifying the position of the center part of the hole 60a in the spin chuck 60, namely, the center position of the wafer W mounted in the processing position S.

Next, the operation of the resist coating unit 17 as structured above is explained together with the steps of a photolithography process performed in the coating and developing treatment system 1.

First, the wafer carrier 7 takes out one unprocessed wafer W from the cassette C and carries it to the adhesion unit 31 which is included in the third processing unit group G3. The wafer W, which is coated with an adhesion promoter such as HMDS for improving fixability with the resist solution in the adhesion unit 31, is carried to the cooling unit 30 by the main carrier 13 and cooled to a predetermined temperature. Thereafter, the wafer W is carried to the resist coating unit 17 or 19.

The wafer W with the resist film formed thereon is carried to the pre-baking unit 33 or 34 and the extension and cooling unit 41 again in sequence by the main carrier 13 to undergo predetermined processing.

Then, the wafer W is taken out from the extension and cooling unit 41 by the wafer carrier 50 and carried to the aligner (not shown) via the peripheral aligner 51. The wafer W after undergoing the exposure processing is carried to the extension unit 42 by the wafer carrier 50 and further carried to the post-exposure baking unit 44 or 45, the developing unit 18 or 20, the post-baking unit 35, 36, 46, or 47, and the cooling unit 30 in sequence by the main carrier 13 to undergo predetermined processing in each of the units. Thereafter, the wafer W is returned to the cassette C by the wafer carrier 7 via the extension unit 32 and a series of predetermined coating and developing treatment is finished.

The operation of the above-described resist coating unit 17 will be explained in detail next. First, before the resist coating treatment for the wafer W is started, for example, in the step of mechanical and electrical adjustment of the resist coating unit 17, the nozzle holder 75 scans over the spin chuck 60 to cause the laser displacement gauge 89 to detect the hole 60a. Then, the detected information is sent to the controlling unit 86 and the controlling unit 86 specifies a position P where the laser displacement gauge 89 detects the hole 60a. The position P is recognized as the center position of the wafer W mounted in the processing position S on the spin chuck 60 and the position data is stored in the controlling unit 86. When the nozzle holder 75 is to be moved to a position above the center position of the wafer W thereafter, an instruction to move the nozzle holder 75 to the position P is given based on the stored position data.

When the resist coating treatment is started, the wafer W after undergoing the preceding process is first carried into the resist coating unit 17 by the main carrier 13. Then, the wafer W is delivered to the spin chuck 60 which is ascended and kept on stand-by in advance and held by suction onto the predetermined processing position S on the spin chuck 60.

When the wafer W is held on the spin chuck 60, the carrier 67 moves in the X-direction to transfer the nozzle holder 75 to a position above the nozzle box 64. At this time, the nozzle holder 75 is also moved in the Y-direction by the drive belt 81 and thereby, transferred to a position above, for example, the resist solution supply nozzle 66a which is kept on stand-by in the recessed portion 64a in the nozzle box 64. The nozzle holder 75 then descends in the Z-direction to have the inserting portion 87 of the nozzle holder 75 inserted into the receiving portion 70a in the resist solution supply nozzle 66a. Then, for example, air is flowed into the inserting portion 87 so that the pressing portions 88 press against the inner wall of the receiving portion 70a to cause the nozzle holder 75 to hold the resist solution supply nozzle 66a.

The resist solution supply nozzle 66a held by the nozzle holder 75 is transferred to the position P above the center of the wafer W by the carrier 67. At this time, the resist solution supply nozzle 66a moves linearly to the position P from the stand-by position T. After that, the rotation of the spin chuck 60 is started to rotate the wafer W at a predetermined rotational speed. Then, a predetermined amount of the resist solution is supplied to the center of the wafer W from the discharging port 68a of the resist solution supply nozzle 66a for a predetermined length of time to form the predetermined resist film on the wafer W When the resist film is formed after the predetermined amount of the resist solution is applied on the wafer W, the resist solution supply nozzle 66a is again transferred linearly to the stand-by position T by the carrier 67 and returned to the recessed portion 64a in the nozzle box 64.

Meanwhile, the wafer W with the resist film formed thereon is ascended by the spin chuck 60 and delivered to the main carrier 13 from the spin chuck 60. Then, when the wafer W is carried from the resist coating unit 17 to the pre-baking unit 33 where the next process is carried out, the resist coating treatment is finished.

When a subsequent wafer W is carried into the resist coating unit 17, it undergoes the above-described resist coating treatment, but when some change in a recipe and so on are made, another one of the resist solution supply nozzles, for example, the resist solution supply nozzle 66b is selected to be used in the same manner.

According to the embodiment described above, the nozzle holder 75 is movable in the Y-direction as well as in the X-direction and the Z-direction, in other words, movable in three dimensions, and thereby, fine adjustment of the position of the nozzle holder 75, particularly, fine adjustment for positioning the resist solution supply nozzle 66a above the center of the wafer W can appropriately be made. As a result, the resist solution discharged from the resist solution supply nozzle 66a is accurately supplied onto the center of the wafer W so that the discharge length of time is shortened, which allows the supply amount of the resist solution to be decreased, compared with that when the resist solution is not supplied onto the center of the wafer W.

Moreover, the resist solution supply nozzles 66a to 66d are arranged in the arc shape and when the resist solution supply nozzle 66a is carried, it is moved linearly toward the position P above the center of the wafer W so that the tube 69a extending from the resist solution supply nozzle 66a is prevented from contacting another resist solution supply nozzle 66b, the tube 69b, and so on, which makes it possible to prevent the tube 69a from braking due to the contact.

Furthermore, the laser displacement gauge 89 is provided in the inserting portion 87 of the nozzle holder 75 to detect the hole 60a in the spin chuck 60 before the resist coating treatment and to specify the position P of the hole 60a based on the detection result, which makes it possible to locate the actual position P of the hole 60a, namely the position P of the center of the wafer W. Therefore, even when the actual center position of the wafer W is deviated from a designed position, the position P of the center of the wafer W can accurately be specified to move the resist solution supply nozzle 66a to the position above the center of the wafer W.

Figure 10:
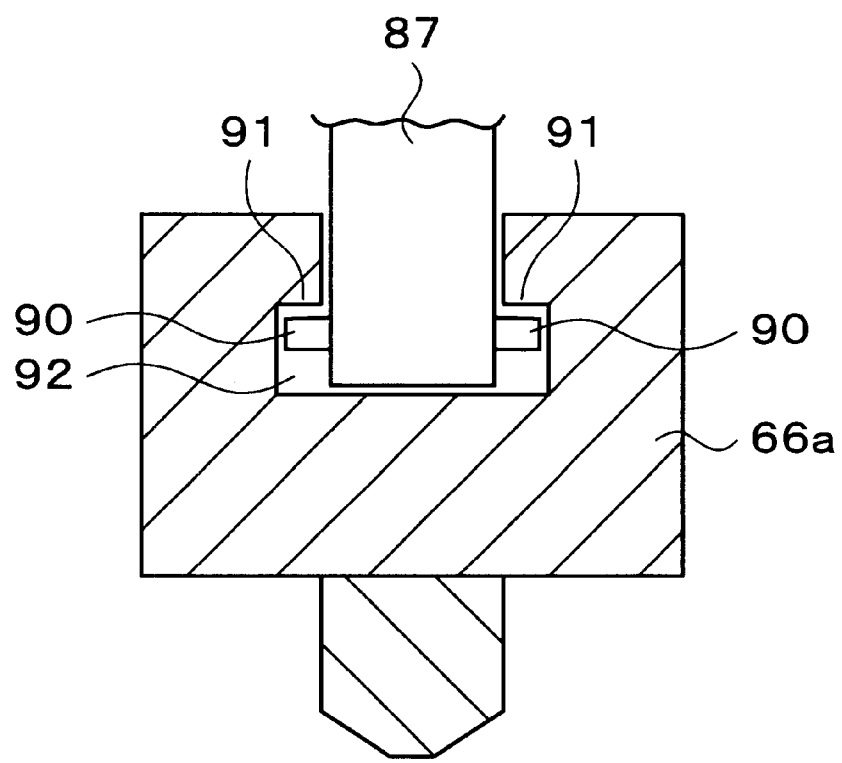
FIG. 10 is an explanatory view of a vertical cross section showing another example where the nozzle holder holds the resist solution supply nozzle.
Figure 11:
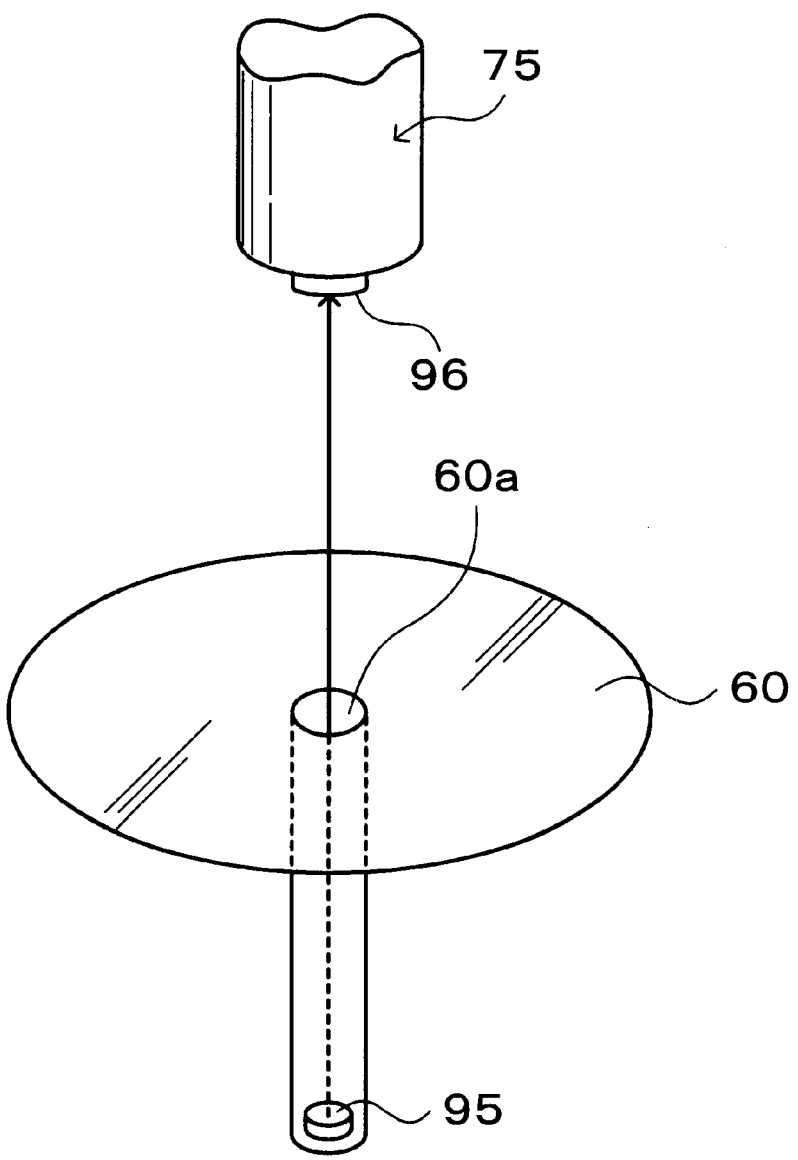
FIG. 11 is a perspective view showing another means for specifying the center of a wafer mounted on a spin chuck.

According to the above embodiment, the pressing portions 88 of the inserting portion 87 of the nozzle holder 75 press against the inner wall of the receiving portion 70a in the resist solution supply nozzle 66a so that the nozzle holder 75 holds the resist solution supply nozzle 66a, but the resist solution supply nozzle 66a may be held in a manner in which the pressing portions 88 are replaced by protruding portions 90, catching portions 91 are formed in the inner wall of the receiving portion 70a, and the protruding portions 90 are caught in the catching portions 91, as shown in FIG. 10. The catching portions 91 are formed, for example, by forming a ring-shaped groove 92 in the inner wall of the receiving portion 70a. This structure also enables the nozzle holder 75 to releasably hold the resist solution supply nozzle 66a with the protruding portions 90 protruding and recessing.

According to the above embodiment, the laser displacement gauge 89 specifies the center position of the wafer W before the resist coating treatment is started but other means may be used for this purpose. The other means will be explained below.

It is first proposed that a light-emitting part 95 is provided in the hole 60a of the spin chuck 60 and a light-receiving part 96 is provided on a center part of a lower end of the nozzle holder 75. An LED light from a light-emitting diode and a laser beam are used as a light source for the light-emitting part 95. A linear light is appropriate in any case. At this time, light-receiving information on the light-receiving part 96 is inputted and stored in the controlling unit 86 so that a position where the light-receiving part 96 receives the laser beam or the LED light is specified in the controlling unit 86. When the center position of the wafer W is to be specified, the nozzle holder 75 scans over the spin chuck 60 to have the light-receiving part 96 receive the light and thereby, the center of the spin chuck 60, namely, the position P of the center of the wafer W held on the spin chuck 60 is specified. The position P of the center of the wafer W is also specified in this case so that the resist solution supply nozzle 66a can be moved accurately to the position P above the wafer W to have the resist solution supplied accurately onto the center of the wafer W.

Figure 12A:
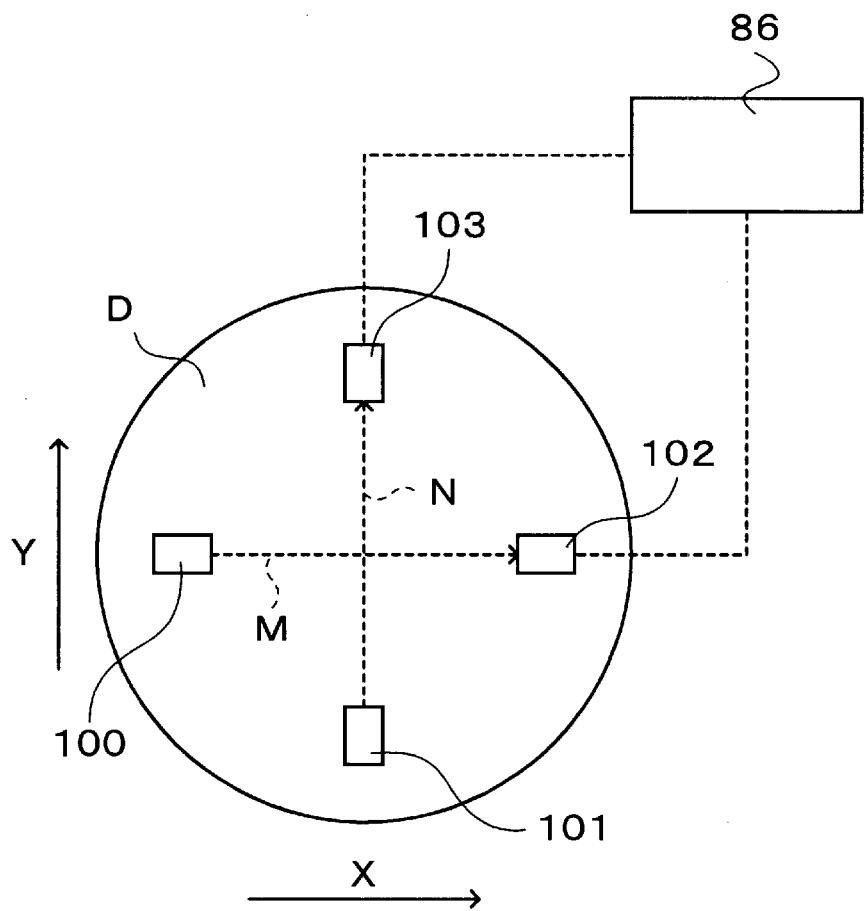
FIG. 12 shows a structure example of a dummy wafer, FIG. 12A being a plan view and FIG. 12B being a side view.
Figure 12B:
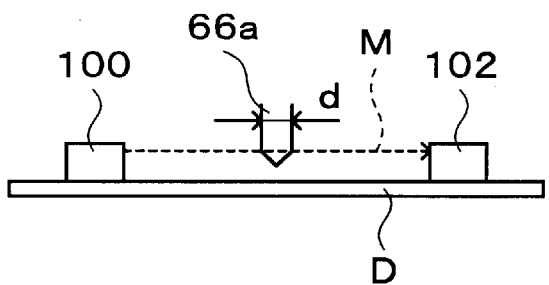

Next, a method for specifying the center position of the wafer W using a dummy wafer D, which serves as a position detector, having the same shape as that of the wafer W is proposed. In this case, for example, a laser-beam-emitting part 100, which serves as a light-emitting part emitting a light in the X-direction through the center of the dummy wafer D, for emitting a coherent laser beam and a laser-beam-emitting part 101, which serves as a light-emitting part emitting a light in the Y-direction through the center of the dummy wafer D, for emitting a laser beam are provided on the dummy wafer D, as shown in FIG. 12A and FIG. 12B.

Furthermore, light-receiving parts 102 and 103 for receiving the laser lights emitted from the laser-beam-emitting parts 100 and 101 respectively are provided. Therefore, an intersection part of lights M and N emitted linearly is the center part of the dummy wafer D. Each of the light-receiving parts 102 and 103 is structured to be able to send light-blocking information to the controlling unit 86 when the laser beam is blocked and is not received.

When the center position of the wafer W is to be specified, the dummy wafer D is first mounted in the processing position S on the spin chuck 60, in exactly the same manner as that for the wafer W. Next, the nozzle holder 75 holding the resist solution supply nozzle 66a is transferred in the X-direction above the dummy wafer D. In this case, the arm portion 76 supporting the resist solution supply nozzle 66a is appropriately moved in a vertical direction in advance to adjust a vertical position of the resist solution supply nozzle 66a so that a lower end of the resist solution supply nozzle 66a does not contact the surface of the dummy wafer D and is positioned lower than the lights M and N as well.

Then, when the resist solution supply nozzle 66a passes an X-ordinate of the center of the dummy wafer D, the laser beam in the Y-direction is blocked temporarily by the resist solution supply nozzle 66a and the blocking information is sent to the controlling unit 86 from the light-receiving part 103. The resist solution supply nozzle 66a has a certain width d as shown in FIG. 12B and therefore, when an intermediate position between a position where the blocking of the laser beam is started and a position where the blocking of the laser beam is terminated is calculated in the controlling unit 86, the X-ordinate of the center of the dummy wafer D can be specified. Similarly, a Y-ordinate of the center of the dummy wafer D can be specified when the resist solution supply nozzle 66 is moved in the Y-direction to block the laser beam in the X-direction. At this time, the resist solution supply nozzle 66a is in a position where it blocks the lights M and N synchronously. This means that the position where it blocks both of the lights M and N synchronously is the center part of the dummy wafer D.

The center position of the dummy D is thus specified so that the position P of the center of the ordinary wafer W when the wafer W is mounted in the predetermined position S can be specified. Furthermore, as described above, the movement of the resist solution supply nozzle 66a to the position where it blocks the lights M and N synchronously enables the resist solution supply nozzle 66a to be easily positioned in the center of the dummy wafer D, namely, the position P of the center of the wafer W so that a proper discharge position of the resist solution can easily be specified.

Incidentally, the LED light using the light-emitting diode may be used for the light-emitting part instead of the laser beam.

According to the above embodiment, only the position P of the center of the wafer W mounted in the processing position S on the spin chuck 60 is specified but the stand-by position T of the resist solution supply nozzle 66a may also be specified. In this case, for example, the inserting portion 87 of the nozzle holder 75 is manually inserted into the receiving portion 70a in the resist solution supply nozzle 66a which is kept on stand-by, for example, in the recessed portion 64a. Then, the position of the nozzle holder 75 at this time is recognized by the controlling unit 86 which serves as a specifying mechanism so that an accurate position of the recessed portion 64a can be specified. When the position of the recessed portion 64a is specified, the position of the nozzle box 64 is specified, and thereby the stand-by position T can be specified.

In this way, even when the position of the nozzle box 64 is delicately deviated from the designed position, the stand-by position T can be accurately located, which enables the nozzle holder 75 to appropriately hold each of the resist solution supply nozzles 66a to 66d.

Figure 13:
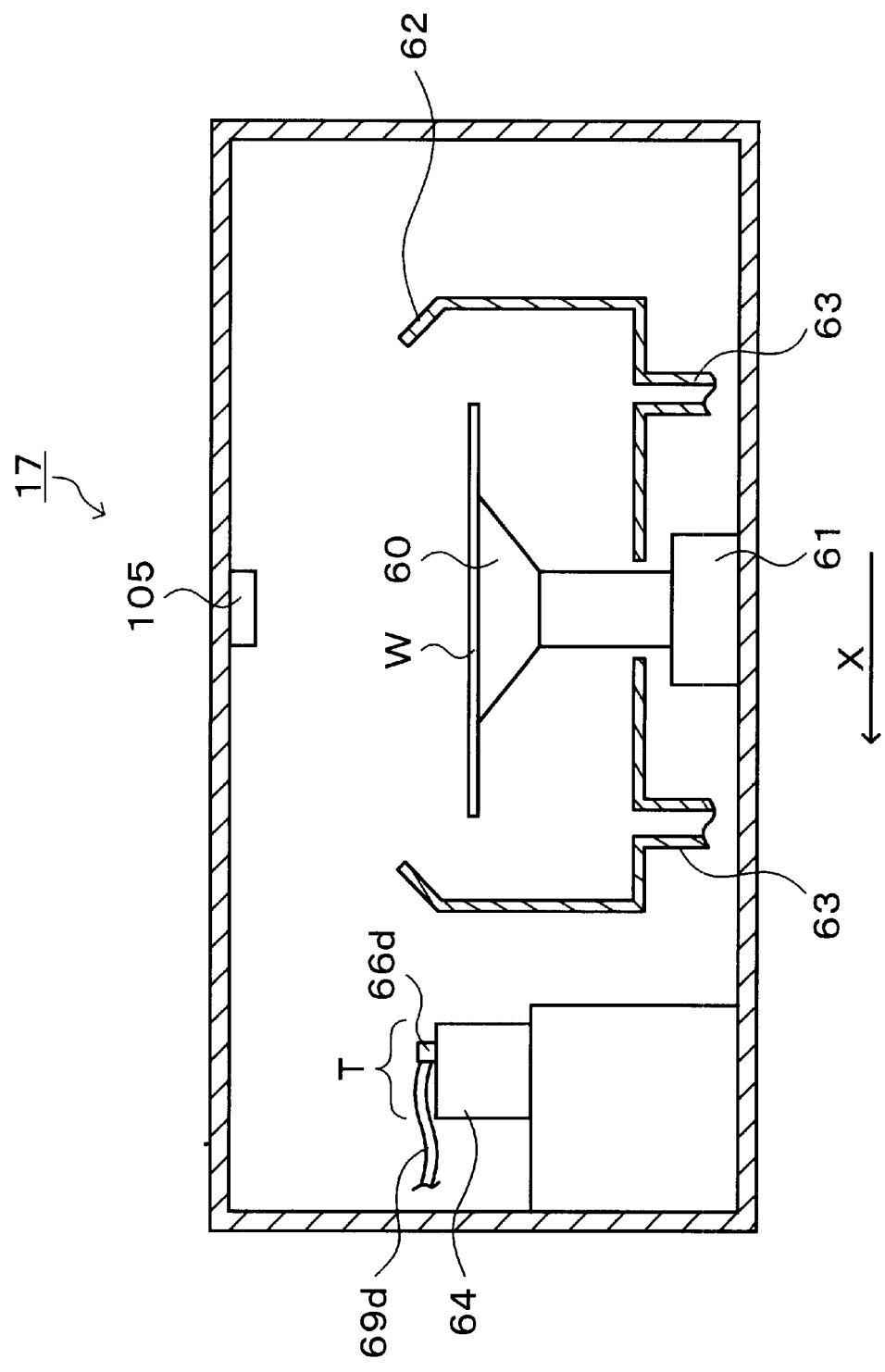
FIG. 13 is an explanatory view of a vertical cross section of the resist coating unit when a CCD camera is provided therein.

Moreover, the wafer W may be monitored after the resist coating treatment for the wafer W is started and the resist solution is supplied onto the wafer W. In this case, for example, a CCD camera 105 which serves as an image pickup device is provided in an upper part of the resist coating unit 17, for example, as shown in FIG. 13. When the monitoring of the wafer W supplied with the resist solution shows that the resist solution is not supplied strictly to the center of the wafer W, the position of the resist solution supply nozzle 66a is finely adjusted. This makes it possible to supply the resist solution accurately to the center of the wafer W and to reduce the required amount of the resist solution.

Figure 14:
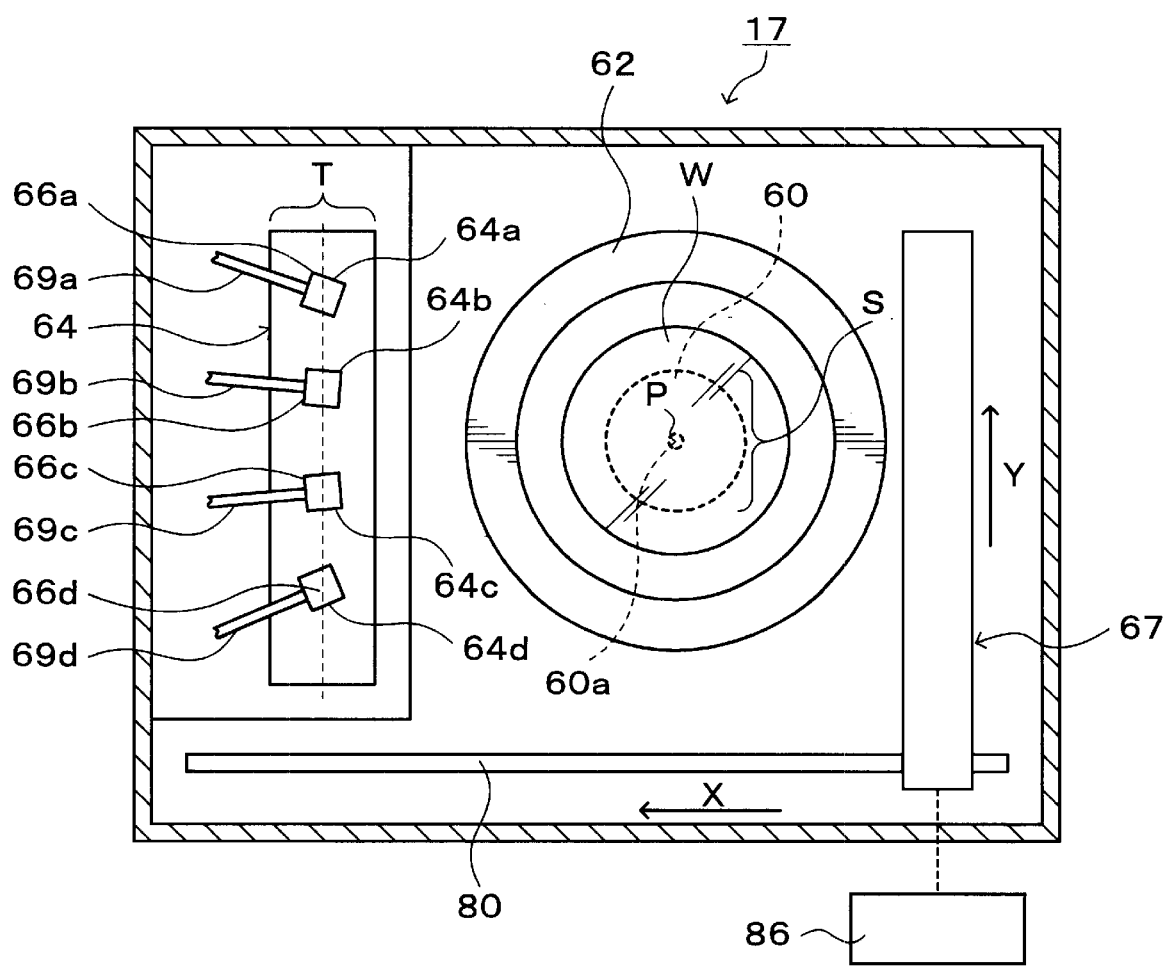
FIG. 14 is a plan view showing the inner appearance of the resist coating unit when the resist solution supply nozzles are arranged linearly.
Figure 15:
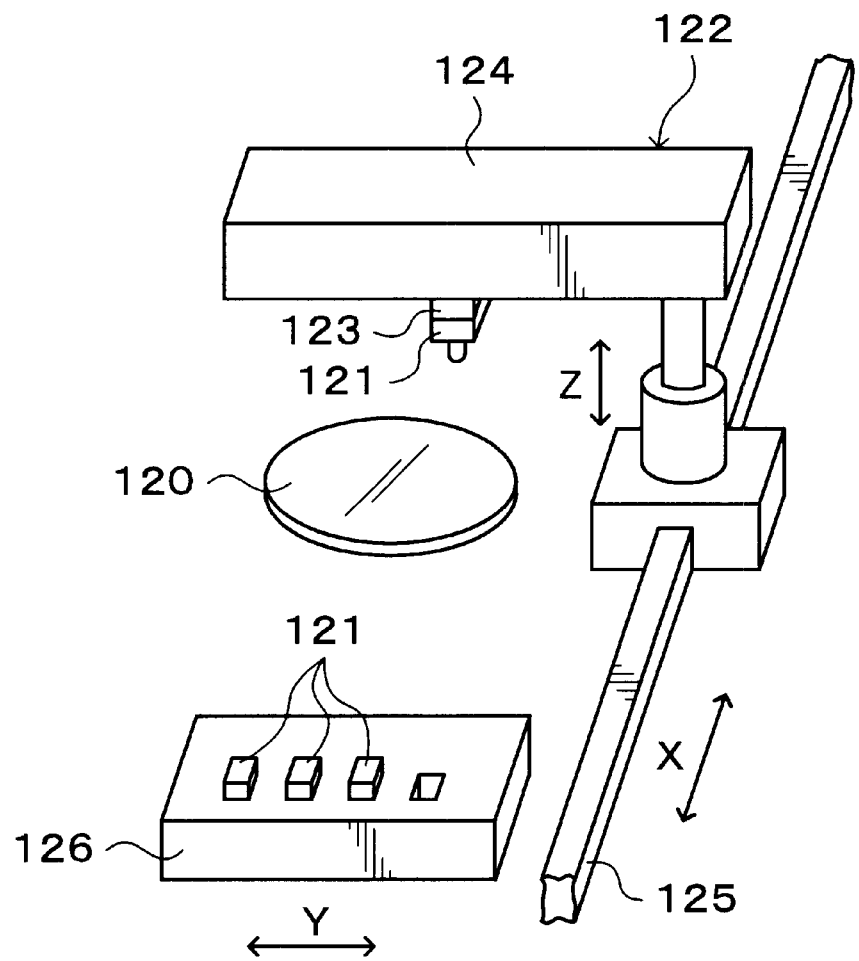
FIG. 15 is an explanatory view showing a schematic structure of a conventional resist solution supply apparatus.

According to the above embodiment, the resist solution supply nozzles 66a to 66d are arranged in the arc shape in the nozzle box 64 but the resist solution supply nozzles 66a to 66d may be linearly arranged as shown in FIG. 14.

The resist solution supply nozzles 66a to 66d are linearly arranged in the Y-direction in the example shown in FIG. 14. Each of the resist solution supply nozzles 66a to 66d itself is disposed to extend radially toward the center P. In other words, each of the resist solution supply nozzles 66a to 66d is directed to the center P. Accordingly, the tubes 69a to 69d are also arranged radially to extend in an outward direction.

This arrangement example of the nozzles eliminates the necessity of the position adjustment in the X-direction when the nozzle holder 75 releases one of the resist solution supply nozzles and then catches another one of the resist solution supply nozzles and thereby, enables the nozzle holder 75 to release and catch the resist solution supply nozzle quickly and accurately. In this case, each of the resist solution supply nozzles 66a to 66d itself is also disposed to extend radially toward the center P and each of the tubes 69a to 69d is also disposed to extend radially in the outward direction so that the tubes 69a to 69d do not contact each other to be prevented from breaking at the time of the releasing and catching operations.

According to the above embodiment, an example where the present invention is applied to the resist solution supply apparatus used in the resist coating unit is described but the present invention is also applicable to a supply unit for supplying other treatment solutions, for example, a developing solution. Furthermore, the present invention is also applicable to a treatment solution supply apparatus for substrates other than the wafer W, for example, an LCD substrate.

According to the present invention, the treatment solution can accurately be supplied to the center of the substrate by finely adjusting the position of the treatment solution supply nozzle, which makes it possible to reduce the used amount of the treatment solution and realize cost reduction. Moreover, the use of the function which enables the nozzle holder to move in three dimensions can realize the automation of the operations which are conventionally carried out manually and can improve accuracy and swiftness of the operations.

Furthermore, according to the present invention, the actual center position of the substrate can be specified so that the treatment solution can be supplied accurately to the center of the substrate even when the center position of the substrate is deviated from the designed position due to vibration and so on.

What is claimed is:

1. A treatment solution supply apparatus for supplying a treatment solution onto a substrate which is disposed in a predetermined processing position on a mounting portion, comprising:
   a treatment solution supply nozzle for supplying the treatment solution onto the substrate; and
   a nozzle holder for releasably holding said treatment solution supply nozzle;
   wherein said treatment solution supply nozzle is disposed in a predetermined stand-by position and said treatment solution supply nozzle includes a receiving portion for allowing the inserting portion to be inserted therein;
   wherein said nozzle holder is movable in three dimensions and said nozzle holder includes an inserting portion;
   wherein the inserting portion includes a pressing portion which is capable of protruding toward an inner wall of the receiving portion, and
   wherein the receiving portion includes a catching portion for catching the protruding portion.

2. A treatment solution supply apparatus according to claim 1,
   wherein a plurality of said treatment solution supply nozzles are provided and said plural treatment solution supply nozzles are disposed outside the substrate which is in the processing position and are arranged in an arc shape with a center of the substrate being a center of the arc.

3. A treatment solution supply apparatus according to claim 2,
   wherein each of said treatment solution supply nozzles includes each of treatment solution tubes for supplying the treatment solution, and
   wherein each of the treatment solution tubes is disposed to extend radially in an outward direction from each of said treatment solution supply nozzles with the center of the substrate being a center of the radiation.

4. A treatment solution supply apparatus according to claim 1,
   wherein a plurality of said treatment solution supply nozzles are provided and said plural treatment solution supply nozzles are disposed outside the substrate which is in the processing position and are linearly arranged.

5. A treatment solution supply apparatus according to claim 4,
   wherein each of said treatment solution supply nozzles includes each of treatment solution tubes for supplying the treatment solution, and
   wherein each of the treatment solution tubes is disposed to extend radially in an outward direction from each of said treatment solution supply nozzles with the center of the substrate being a center of the radiation.

6. A treatment solution supply apparatus for supplying a treatment solution onto a substrate which is disposed in a predetermined processing position on a mounting portion, comprising:
   a treatment solution supply nozzle for supplying the treatment solution onto the substrate;
   a nozzle holder for releasably holding said treatment solution supply nozzle;
   a hole formed in a center of the processing position on the mounting portion;
   a light-emitting part for emitting a light through said hole in an upward direction;
   a light-receiving part, which is provided in said nozzle holder, for receiving the emitted light; and
   a specifying device for specifying, based on a position where said light-receiving part receives the light from said light-emitting part, a position of a center of the substrate disposed in the processing position; and
   wherein said treatment solution supply nozzle is disposed in a predetermined stand-by position, and
   wherein said nozzle holder is movable in three dimensions.

7. A treatment solution supply apparatus for supplying a treatment solution onto a substrate which is disposed in a predetermined processing position on a mounting portion, comprising:
   a treatment solution supply nozzle for supplying the treatment solution onto the substrate;
   a nozzle holder for releasably holding said treatment solution supply nozzle;
   a hole formed in a center of the processing position on the mounting portion;
   a laser displacement gauge which is provided in said nozzle holder, for detecting said hole; and
   a specifying device for specifying, based on a position of said hole detected by said laser displacement gauge, a position of a center of the substrate disposed in the processing position; and
   wherein said treatment solution supply nozzle is disposed in a predetermined stand-by position, and
   wherein said nozzle holder is movable in three dimensions.

8. A treatment solution supply apparatus for supplying a treatment solution onto a substrate which is disposed in a predetermined processing position on a mounting portion, comprising:
   a treatment solution supply nozzle for supplying the treatment solution onto the substrate; and
   a nozzle holder for releasably holding said treatment solution supple nozzle;

wherein said treatment solution supply nozzle is disposed in a predetermined stand-by position and said treatment solution supply nozzle includes a receiving portion for allowing the inserting portion to be inserted therein;

wherein said nozzle holder is movable in three dimensions and said nozzle holder includes an inserting portion, and wherein the inserting portion includes a pressing portion which is capable of pressing against the receiving portion from an inner side.

9. A treatment solution supply apparatus according to claim 8, wherein a plurality of said treatment solution supply nozzles are provided and said plural treatment solution supply nozzles are disposed outside the substrate which is in the processing position and are arranged in an arc shape with a center of the substrate being a center of the arc.

10. A treatment solution supply apparatus according to claim 8, wherein a plurality of said treatment solution supply nozzles are provided and said plural treatment solution supply nozzles are disposed outside the substrate which is in the processing position and are linearly arranged.

11. A treatment solution supply apparatus according to claim 6, further comprising:

a specifying mechanism for specifying, based on a position of said nozzle holder when said nozzle holder holds an optional one of said treatment solution supply nozzles which is positioned in the stand-by position, coordinates of the stand-by position of the optional treatment solution supply nozzle in a coordinate system including the processing position.

12. A treatment solution supply apparatus according to claim 7, further comprising:

a specifying mechanism for specifying, based on a position of said nozzle holder when said nozzle holder holds an optional one of said treatment solution supply nozzles which is positioned in the stand-by position, coordinates of the stand-by position of the optional treatment solution supply nozzle in a coordinate system including the processing position.

13. A treatment solution supply apparatus according to claim 6, further comprising:

an image pickup device for monitoring at least a center part of the substrate which is disposed in the processing position.

14. A treatment solution supply apparatus according to claim 7, further comprising:

an image pickup device for monitoring at least a center part of the substrate which is disposed in the processing position.

* * * * *